(12) United States Patent
Sugita et al.

(10) Patent No.: US 11,869,752 B2
(45) Date of Patent: Jan. 9, 2024

(54) SYSTEM AND METHOD FOR TRANSFERRING A FOCUS RING INTO PROCESSING APPARATUS

(71) Applicant: Tokyo Electron Limited, Tokyo (JP)

(72) Inventors: Kippei Sugita, Miyagi (JP); Kenji Nagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 538 days.

(21) Appl. No.: 17/111,679

(22) Filed: Dec. 4, 2020

(65) Prior Publication Data

US 2021/0183628 A1 Jun. 17, 2021

(30) Foreign Application Priority Data

Dec. 12, 2019 (JP) .................................. 2019-224553

(51) Int. Cl.
*H01J 37/32* (2006.01)
*H01J 37/22* (2006.01)
*H01J 37/244* (2006.01)

(52) U.S. Cl.
CPC ...... *H01J 37/32642* (2013.01); *H01J 37/226* (2013.01); *H01J 37/244* (2013.01); *H01J 2237/2446* (2013.01)

(58) Field of Classification Search
CPC ... H01J 37/32642; H01J 37/226; H01J 37/244
See application file for complete search history.

(56) References Cited

U.S. PATENT DOCUMENTS

2020/0194295 A1\* 6/2020 Sugita ............... H01L 21/67742
2021/0057252 A1\* 2/2021 Sugita ............... H01L 21/67109

FOREIGN PATENT DOCUMENTS

JP 2006-196691 A 7/2006

\* cited by examiner

*Primary Examiner* — Joseph L Williams
(74) *Attorney, Agent, or Firm* — Pearne & Gordon LLP

(57) ABSTRACT

A transfer system configured to transfer a focus ring includes a processing system and a position detection system. The processing system includes a processing apparatus including a chamber main body and a placing table having a substrate placing region and a focus ring placing region; and a transfer device configured to transfer the focus ring. The position detection system includes a light source; multiple optical elements configured to output light and receive reflected light; a driving unit configured to move each optical element to allow each optical element to scan a scanning range; and a controller configured to calculate, based on the reflected light in the scanning range, a positional relationship between the placing table and the focus ring for each optical element. The transfer device is configured to adjust a transfer position of the focus ring onto the focus ring placing region based on the calculated positional relationship.

4 Claims, 11 Drawing Sheets

SYSTEM AND METHOD FOR TRANSFERRING A FOCUS RING INTO PROCESSING APPARATUS

CROSS-REFERENCE TO RELATED APPLICATION

This application claims the benefit of Japanese Patent Application No. 2019-224553 filed on Dec. 12, 2019, the entire disclosure of which is incorporated herein by reference.

TECHNICAL FIELD

The various aspects and embodiments described herein pertain generally to a transfer system and a method therefor.

BACKGROUND

Patent Document 1 describes a semiconductor manufacturing apparatus. This apparatus includes a substrate processing chamber, a focus ring standby chamber, and a transfer device. An electrode is disposed within the substrate processing chamber. A substrate is placed on the electrode. The focus ring standby chamber accommodates therein a multiple number of focus rings. The transfer device transfers the focus ring accommodated in the focus ring standby chamber into the substrate processing chamber without opening the substrate processing chamber to the atmosphere. The focus ring is placed to surround the substrate placed on the electrode.

Patent Document 1: Japanese Patent Laid-open Publication No. 2006-196691

SUMMARY

In one exemplary embodiment, there is provided a transfer system configured to transfer a focus ring into a processing apparatus. The transfer system includes a transfer device and a position detection system. The processing apparatus includes a chamber main body; and a placing table disposed within a chamber provided by the chamber main body. The placing table has a substrate placing region and a focus ring placing region surrounding the substrate placing region. The transfer device is configured to transfer the focus ring onto the focus ring placing region. The position detection system includes a light source, multiple optical elements, a driving unit and a controller. The light source is configured to generate measurement light. The multiple optical elements are configured to output the measurement light generated from the light source as output light and configured to receive reflected light. The driving unit is configured to move each of the multiple optical elements to allow each of the optical elements to scan a scanning range from the focus ring placed on the focus ring placing region to the substrate placing region. The controller is configured to calculate, based on the reflected light in the scanning range, a positional relationship between the placing table and the focus ring placed on the focus ring placing region for each of the multiple optical elements. The transfer device is configured to adjust a transfer position of the focus ring onto the focus ring placing region based on the positional relationship calculated by the controller.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
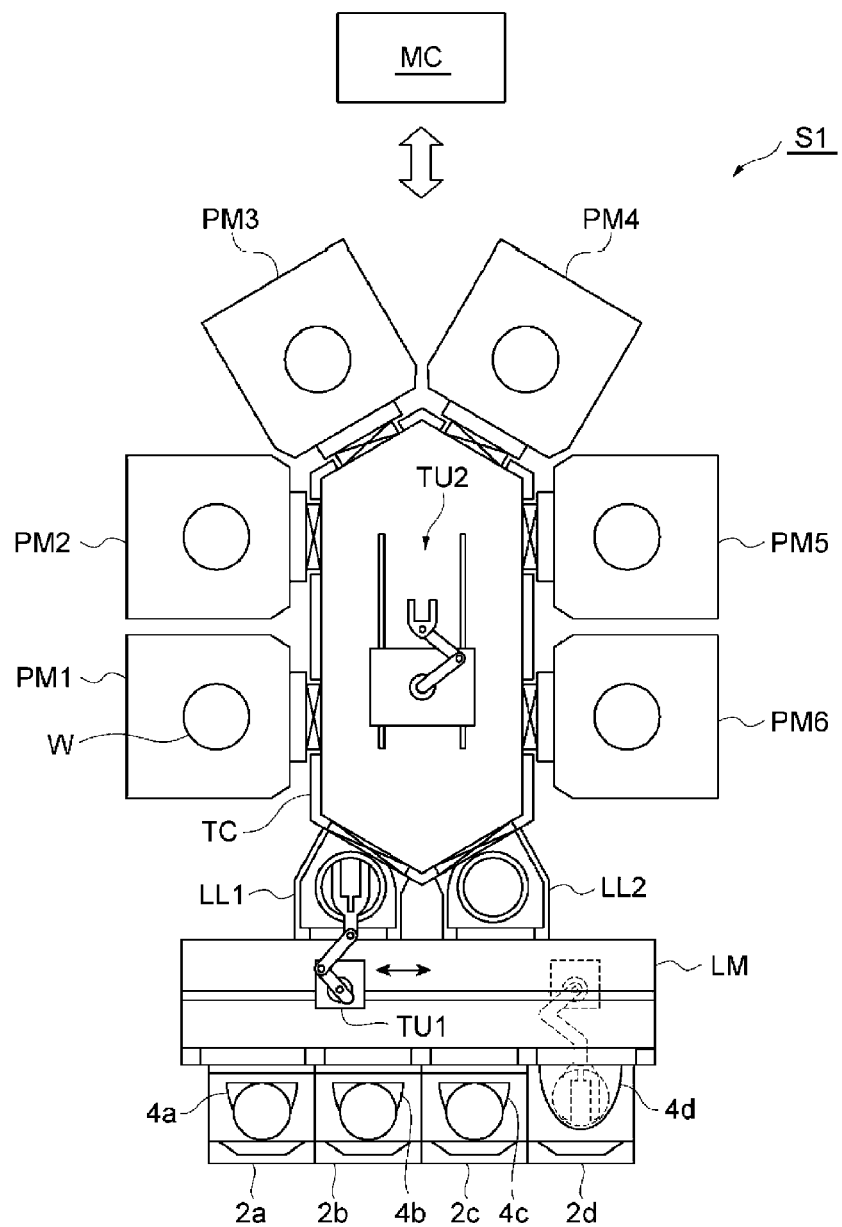
FIG. 1 is a diagram illustrating an example of a processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

In one exemplary embodiment, there is provided a transfer system configured to transfer a focus ring into a processing apparatus. The transfer system includes a transfer device and a position detection system. The processing apparatus includes a chamber main body; and a placing table disposed within a chamber provided by the chamber main body. The placing table has a substrate placing region and a focus ring placing region surrounding the substrate placing region. The transfer device is configured to transfer the focus ring onto the focus ring placing region. The position detection system includes a light source, multiple optical elements, a driving unit and a controller. The light source is configured to generate measurement light. The multiple optical elements are configured to output the measurement light generated from the light source as output light and configured to receive reflected light. The driving unit is configured to move each of the multiple optical elements to allow each of the optical elements to scan a scanning range from the focus ring placed on the focus ring placing region to the substrate placing region. The controller is configured to calculate, based on the reflected light in the scanning range, a positional relationship between the placing table and the focus ring placed on the focus ring placing region for each of the multiple optical elements. The transfer device is configured to adjust a transfer position of the focus ring onto the focus ring placing region based on the positional relationship calculated by the controller.

In the above described transfer system, by allowing the multiple optical elements to scan, the height of the focus ring with respect to the height of the substrate placing region in the scanning range is detected. Based on the variation amount of this height, the positional relationship between the focus ring and the placing table in the scanning rage is calculated. The substrate placing region has the circular shape, and the outer diameter of the substrate placing region and the inner diameter of the focus ring are previously set. Thus, the position detection system is capable of calculating the positional relationship between the focus ring and the placing table by allowing the multiple optical elements to scan, and thus capable of adjusting the transfer position of the focus ring based on this positional relationship.

In the exemplary embodiment, the multiple optical elements is three or more optical elements, and each of the multiple optical elements is disposed to output the measurement light to an end portion of the substrate placing region. The controller may be configured to determine, when the focus ring is transferred onto the focus ring placing region, a positional relationship between the placing table and the focus ring held by the transfer device based on the reflected light on a circumference of the substrate placing region. In this case, since the positional relationship between the placing table and the focus ring is determined in the middle of the transfer of the focus ring, the transfer system is capable of suppressing the contact between the placing table and the focus ring.

In the exemplary embodiment, the controller may be configured to calculate the positional relationship between the placing table and the focus ring placed on the focus ring placing region as polar coordinates. Since the positional relationship between the focus ring and the placing table is calculated as the polar coordinates, the transfer system is capable of clarifying the distance and the direction in which the position deviation between the focus ring and the placing table is adjusted.

In another exemplary embodiment, there is provided a transfer method of transferring a focus ring. The transfer method includes transferring the focus ring onto a focus ring placing region surrounding a substrate placing region on which a substrate is placed; scanning a scanning range from the focus ring placed on the focus ring placing region to the substrate placing region with multiple optical elements each configured to output measurement light as output light and configured to receive reflected light; calculating a positional relationship between the placing table and the focus ring placed on the focus ring placing region based on the reflected light in the scanning range; and deciding a transfer position of the focus ring based on the positional relationship between the placing table and the focus ring placed on the focus ring placing region, which is calculated through the calculating of the positional relationship.

Hereinafter, the various exemplary embodiments will be described in detail with reference to the accompanying drawings. In the various drawings, same or corresponding parts will be assigned same reference numerals.

First Exemplary Embodiment

FIG. 1 is a diagram illustrating an example of a processing system. The processing system S1 shown in FIG. 1 is configured to perform a processing on a target object. The target object is a disk-shaped object as a processing target of a processing apparatus. By way of example, the target object is a wafer W (an example of a substrate). The target object may have a slopped peripheral portion (bevel). A treatment or a plasma processing may or may not be previously performed on this target object.

The processing system S1 includes stages 2a to 2d, receptacles 4a to 4d, a loader module LM, load lock chambers LL1 and LL2, process modules PM1 to PM6 (an example of the processing apparatus), and a transfer chamber TC.

The stages 2a to 2d are arranged along one side of the loader module LM. The receptacles 4a to 4d are mounted on the stages 2a to 2d, respectively. Each of the receptacles 4a to 4d is configured to accommodate wafers W therein.

The loader module LM has a chamber wall which forms and confines therein a transfer space which is in an atmospheric pressure state. The loader module LM has a transfer device TU1 in this transfer space. The transfer device TU1 is configured to transfer the wafers W between the receptacles 4a to 4d and the load lock chambers LL1 and LL2.

The load lock chambers LL1 and LL2 are provided between the load module LM and the transfer chamber TC. Each of the load lock chambers LL1 and LL2 provides a preliminary decompression chamber.

The transfer chamber TC is connected to the load lock chambers LL1 and LL2 via gate valves. The transfer chamber TC is configured as an evacuable decompression chamber, and a transfer device TU2 is accommodated in this decompression chamber. The transfer device TU2 is configured to transfer the wafers W between the load lock chambers LL1 and LL2 and the process modules PM1 to PM6 and between any two of the process modules PM1 to PM6.

The process modules PM1 to PM6 are connected to the transfer chamber TC via gate valves. Each of the process modules PM1 to PM6 is a processing apparatus configured to perform a certain processing such as a plasma processing on the wafer W.

In the processing system S1, a series of operations when a processing is performed on the wafer W are as follows, for example. The transfer device TU1 of the loader module LM takes out the wafer W from one of the wafer receptacles 4a to 4d and transfers the wafer W into either one of the load lock chambers LL1 and LL2. Then, this load lock chamber decompresses the preliminary decompression chamber to a preset pressure. Subsequently, the transfer device TU2 takes out the wafer W from this load lock chamber and transfers the wafer W into any one of the process modules PM1 to PM6. The wafer W is processed by one or more of the process modules PM1 to PM6. Thereafter, the transfer device TU2 transfers the wafer W after being processed into either one of the load lock chambers LL1 and LL2 from the process module. Then, the transfer device TU1 transfers the wafer W from the corresponding load lock chamber into any one of the receptacles 4a to 4d.

The processing system S1 is further equipped with a control device MC (an example of a controller). The control device MC may be a computer including a processor, a storage device such as a memory, a display device, an input/output device, a communication device, and so forth. The above-described series of operations of the processing system S1 are implemented under the control of the control device MC over the individual components of the processing system S1 according to a program stored in the storage device.

Figure 2:
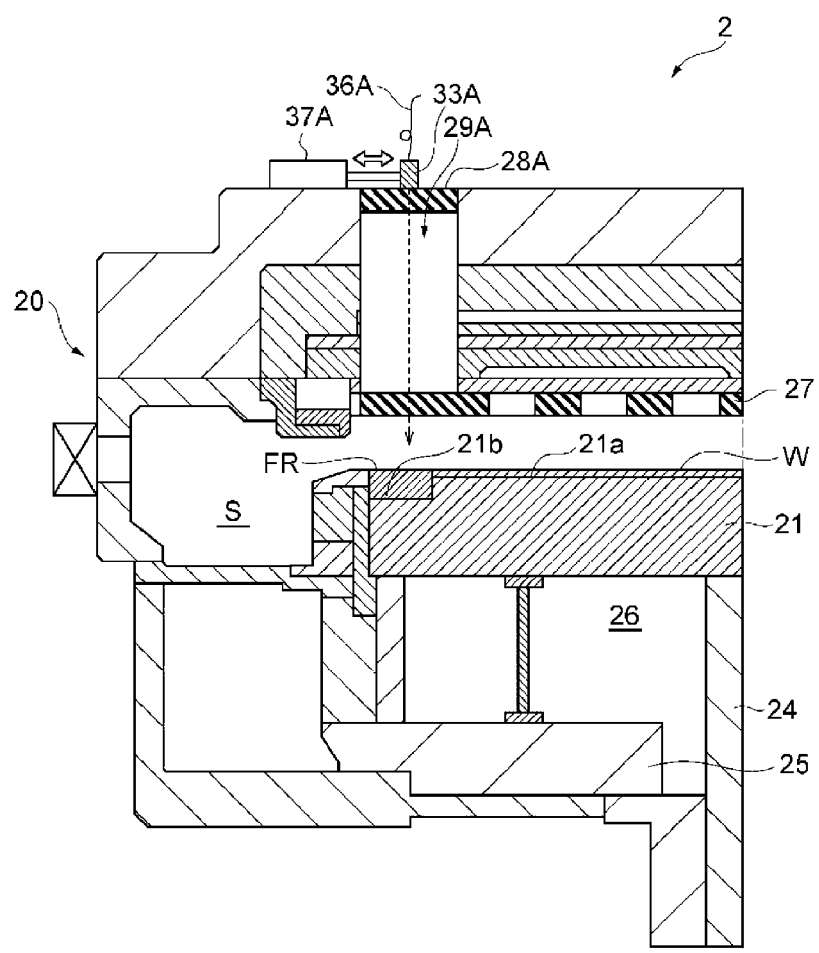
FIG. 2 is a diagram illustrating an example of a longitudinal cross sectional configuration of major parts of a processing apparatus.

Now, a processing apparatus 2 as an example of the process modules PM1 to PM6 will be discussed. FIG. 2 is a longitudinal cross sectional view schematically illustrating a configuration of major components of the processing apparatus 2. As depicted in FIG. 2, the processing apparatus 2 is equipped with a processing vessel 20 (an example of a chamber main body) configured to accommodate therein a wafer W and process it by plasma.

The processing vessel 20 forms and confines a processing chamber S (an example of a chamber) therein. The processing chamber S is configured to be evacuable. A placing table 21 for placing the wafer W and a focus ring FR to be described later thereon is provided in the processing chamber S. The placing table 21 has a stepped shape as a peripheral portion of a top surface portion of a cylindrical body is notched along the entire circumference thereof. That is, a portion of the top surface portion other than the peripheral portion is protruded into a cylindrical shape. The placing table 21 has, on a top surface thereof, a substrate placing region 21a and a focus ring placing region 21b.

The substrate placing region 21a is a region for placing the substrate thereon. The substrate placing region 21a has a circular shape centered on an axis of the placing table 21. The focus ring placing region 21b is a region for placing the focus ring FR thereon. The focus ring placing region 21b is set to surround the substrate placing region 21a. The focus ring placing region 21b is of a circular ring shape defined by two concentric circles. An inner circle forms a circumference of the substrate placing region 21a.

The substrate placing region 21a is protruded higher than the focus ring placing region 21b. A step is formed between the substrate placing region 21a and the focus ring placing region 21b. As an example, a height of the step is equivalent to a difference between the wafer W and the focus ring FR. That is, the protruded portion forms the substrate placing region 21a on which the substrate is placed, and a peripheral portion surrounding this substrate placing region 21a forms the focus ring placing region 21b on which the focus ring FR is placed. An electrostatic chuck mechanism (not shown) configured to attract the wafer W is provided under the substrate placing region 21a. Further, an electrostatic chuck mechanism may be provided under the focus ring placing region 21b as well.

The placing table 21 is made of a conducive material. The placing table 21 is equipped with a RF plate (not shown) to which a high frequency power is applied. The placing table 21 is electrically connected with a high frequency power supply (not shown) via a power feed rod 24.

The focus ring placing region 21b sustains the focus ring FR which surrounds the substrate placing region 21a. The focus ring FR is an annular member. The focus ring FR is configured to improve in-surface uniformity of a plasma processing upon the wafer W. The focus ring FR may be separated from the focus ring placing region 21b and replaced by a new focus ring FR in maintenance. The replacement of the focus ring FR is carried out by, for example, the aforementioned transfer device TU2.

A base plate 25 is provided at a bottom of the processing vessel 20, and a clearance 26 is provided between the placing table 21 and the base plate 25. This clearance 26 has an enough width to insulate the placing table 21 and the base plate 25. Further, a driving mechanism (not shown) for a pusher pin (not shown) is provided in the clearance 26. The pusher pin receives the wafer W from a transfer arm such as the transfer device TU2 and places the received wafer W on the substrate placing region 21a. Further, the pusher pin lifts up the wafer W from the substrate placing region 21a and delivers it to the transfer arm. Furthermore, the pusher pin receives the focus ring FR from a transfer arm such as the transfer device TU2 and places the received focus ring FR on the focus ring placing region 21b. Further, the pusher pin lifts up the focus ring FR from the focus ring placing region 21b and hands it over to the transfer arm. The clearance 26 is not in a vacuum atmosphere but in an atmospheric atmosphere.

A facing electrode 27 is disposed above the placing table 21, facing the placing table 21 at a certain distance therebetween. The facing electrode 27 is configured as a so-called shower head, and is configured to supply a preset processing gas onto the wafer W placed on the substrate placing region 21a in a shower shape. The facing electrode 27 is set to have a ground potential, or a high frequency power is applied thereto.

A first window 28A is formed at an upper portion of the facing electrode 27. The first window 28A is formed downwards from an upper portion of the processing vessel 20. The first window 28A is optically transmissive and has a hermetically sealed structure. The processing vessel 20 is provided with a first through hole 29A corresponding to the first window 28A. The first window 28A and the first through hole 29A constitute a first light introduction path through which measurement light is irradiated to the processing chamber S.

A first optical element 33A (an example of an optical element) as a constituent component of a position detection system 3 to be described later is disposed at an upper end of the first through hole 29A. The first optical element 33A is connected to a light source via a first optical fiber 36A. The first optical element 33A irradiates the measurement light to the processing chamber S through the first window 28A, the first through hole 29A and the facing electrode 27. The first optical element 33A may be, by way of non-limiting example, a collimator or a focuser. The first optical element 33A is connected with a first actuator 37A (an example of a driving unit) configured to move the first optical element 33A in a horizontal direction to allow the first optical element 33A to scan in this horizontal direction. The first actuator 37A is an electrically controllable driving device, for example, a stepping motor.

In the processing vessel 20, multiple light introduction paths having the same configuration as the aforementioned first light introduction path are arranged along a circumferential direction of the placing table 21 and the focus ring FR.

Specifically, a non-illustrated second window 28B and a non-illustrated second through hole 29B as a second light introduction path and a non-illustrated third window 28C and a non-illustrated third through hole 29C as a third light introduction path are provided along the circumferential direction of the placing table 21 and the focus ring FR. Further, a second optical element 33B (an example of the optical element) and a third optical element 33C (an example of the optical element) are disposed in the second light introduction path and the third light introduction path, respectively. Each of the second optical element 33B and the third optical element 33C may be, by way of non-limiting example, a collimator or a focuser. As stated, multiple sets of the window, the through hole and the optical element are provided at the upper portion of the facing electrode 27.

Figure 3:
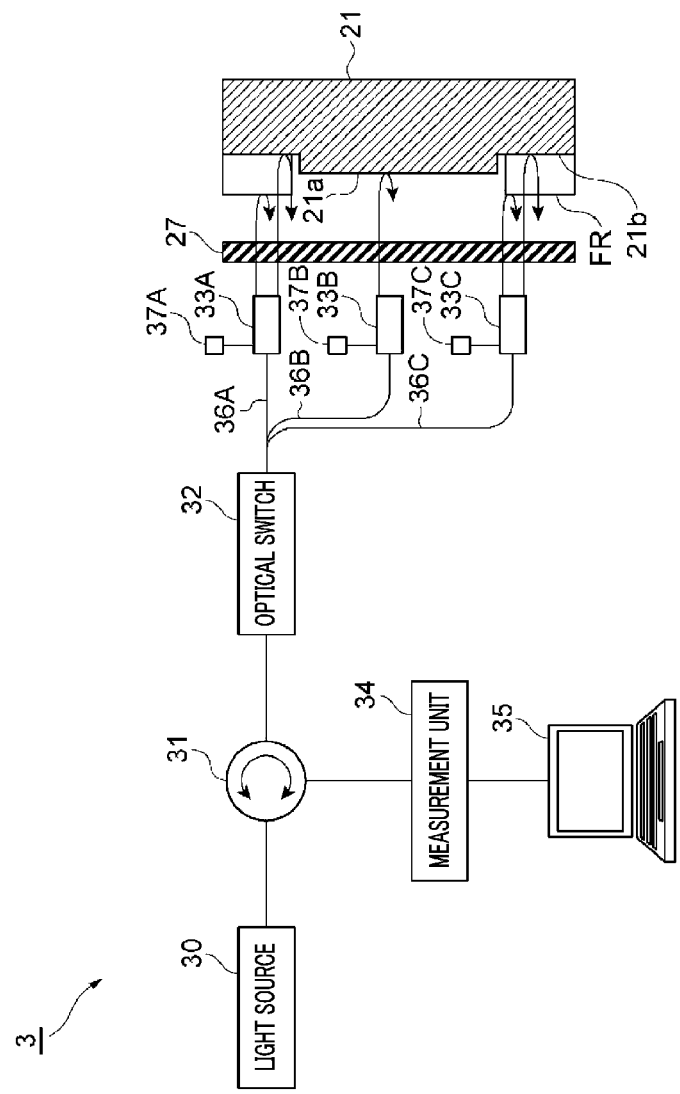
FIG. 3 is a configuration view illustrating an example of a position detection system according to an exemplary embodiment.

FIG. 3 is a configuration view illustrating an example of the position detection system according to the exemplary embodiment. The position detection system 3 is a system configured to measure a distance from a front surface or a rear surface of the facing electrode 27 to a reflection point by using light interference and detect, based on the measurement result, a positional relationship between the placing table 21 and the focus ring FR, for example. As depicted in FIG. 3, the position detection system 3 includes a light source 30, an optical circulator 31, an optical switch 32, the first optical element 33A, the second optical element 33B, the third optical element 33C and a measurement unit 34. Here, however, the position detection system 3 may not be equipped with the optical switch 32.

The measurement unit 34 is connected with an operation device 35 (an example of the controller). The operation device 35 may be a computer including a processor, a storage device, a display device, an input/output device, a communication device, and so forth. A series of operations of the position detection system 3 to be described later are carried out under the control of the operation device 35 over the individual components of the position detection system 3 according to a program stored in the storage device. The storage device previously stores therein a position of the optical element, an inner diameter of the focus ring FR, a size of the substrate placing region 21a, and so forth. The information stored in the storage device is used in an operation of the operation device 35. The operation device 35 and the control device MC shown in FIG. 1 may be configured as a single body. The light source 30, the optical circulator 31, the optical switch 32, the first optical element 33A, the second optical element 33B, the third optical element 33C and the measurement unit 34 are connected by using optical fibers.

The light source 30 is configured to generate measurement light. For example, the light source 30 generates measurement light having a wavelength penetrating a measurement target object. By way of example, a wavelength-sweep light source is used as the light source 30. The measurement target object may be, by way of example, an object (wafer W), or a part (component) of the processing apparatus 2 such as the focus ring FR or the facing electrode 27. The measurement target object is made of, by way of non-limiting example, Si (silicon), $SiO_2$ (quarts), $Al_2O_3$ (sapphire), or the like. An example of the measurement light capable of penetrating the object made of such a material is infrared light.

The optical circulator 31 is connected to the light source 30, the optical switch 32 and the measurement unit 34. The optical circulator 31 propagates the measurement light generated from the light source 30 to the optical switch 32. As an example, the optical switch 32 has one input terminal and three output terminals. The input terminal is connected to the optical circulator 31. Further, the three output terminals are connected to the first optical element 33A, the second optical element 33B and the third optical element 33C via the first optical fiber 36A, the optical fiber 36B and the optical fiber 36C, respectively. The optical switch 32 is configured to change an output destination. The optical switch 32 receives the light from the optical circulator 31 through the input terminal and outputs the received light to the three output terminals alternately.

Each of the first optical element 33A, the second optical element 33B and the third optical element 33C outputs the measurement light generated from the light source 30 as output light and receives reflected light. To elaborate, each of the first optical element 33A, the second optical element 33B and the third optical element 33C outputs the measurement light, which is controlled to be a convergent ray, to the focus ring FR via the facing electrode 27. Each of the first optical element 33A, the second optical element 33B and the third optical element 33C then receives the reflected light from the facing electrode 27 and the focus ring FR. The reflected light includes reflected light from the rear surface as well as reflected light from the front surface. Each of the first optical element 33A, the second optical element 33B and the third optical element 33C propagates the received reflected light to the optical switch 32.

Figure 4:
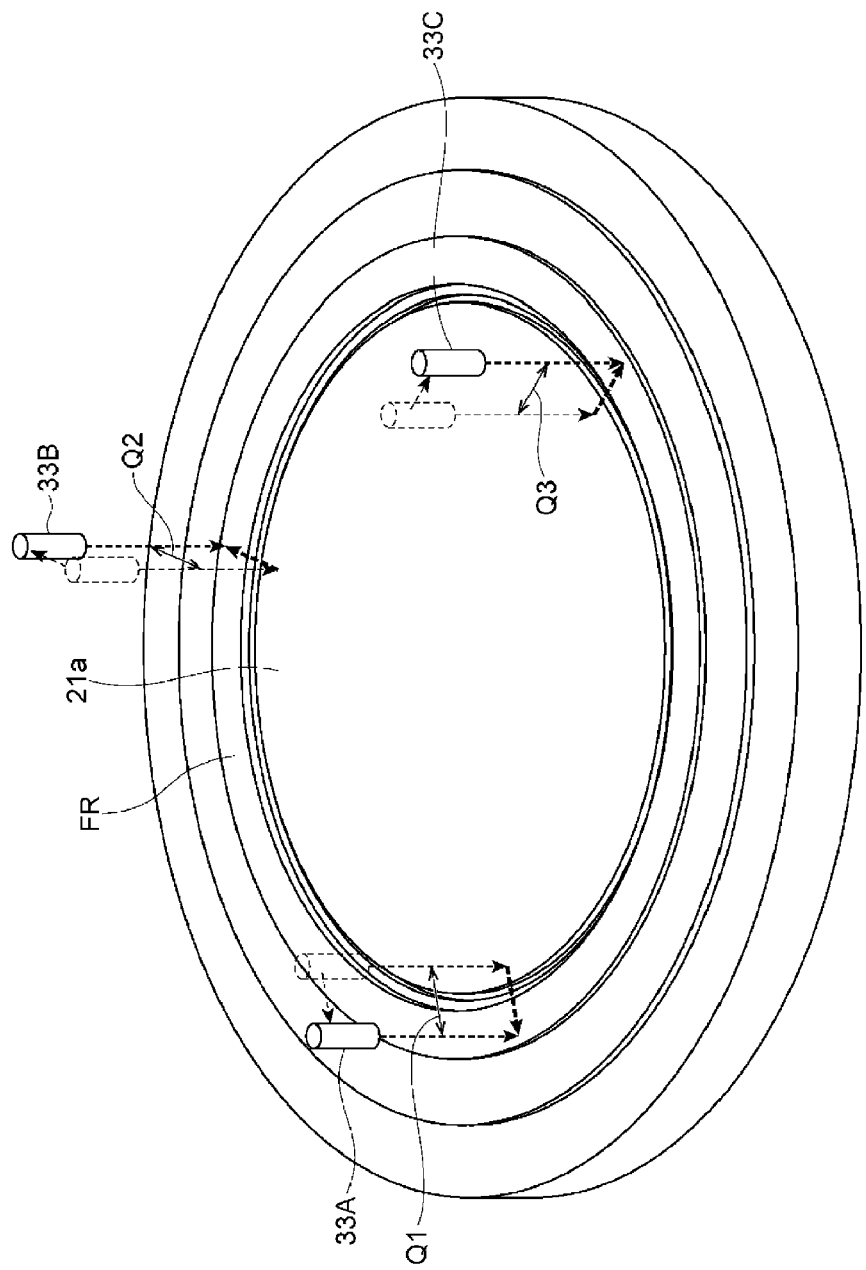
FIG. 4 is a diagram illustrating an example of scanning using three optical elements.

The first actuator 37A (an example of the driving unit), the second actuator 37B (an example of the driving unit) and the third actuator 37C (an example of the driving unit) are driven by the operation device 35 to move the first optical element 33A, the second optical element 33B and the third optical element 33C, respectively, to allow the first optical element 33A, the second optical element 33B and the third optical element 33C to scan a preset scanning range. The first optical element 33A, the second optical element 33B and the third optical element 33C are allowed to scan the preset scanning range by the first actuator 37A, the second actuator 37B and the third actuator 37C, respectively. The scanning range is a range from the substrate placing region 21a to the focus ring FR, and corresponds to, for example, a width of the first through hole 29A and the first window 28A shown in FIG. 2. FIG. 4 is a diagram schematically illustrating an example of scanning using the three optical elements. As shown in FIG. 4, the first optical element 33A is configured to scan within a first scanning range Q1 extending in a diametrical direction. The second optical element 33B is configured to scan within a second scanning range Q2 extending in the diametrical direction at a position spaced apart from the first scanning range Q1 in the circumferential direction. The third optical element 33C is configured to scan within a third scanning range Q3 extending in the diametrical direction at a position spaced apart from the first scanning range Q1 and the second scanning range Q2 in the circumferential direction. A scanning direction may be a diametrically outward direction or a diametrically inward direction.

Referring back to FIG. 3, the optical switch 32 outputs the reflected lights obtained by the first optical element 33A, the second optical element 33B and the third optical element 33C to the optical circulator 31 alternately. The optical circulator 31 outputs each received reflected light to the measurement unit 34. The measurement unit 34 measures a spectrum of the reflected light obtained from the optical circulator 31. The spectrum of the reflected light indicates an intensity distribution dependent on a wavelength or a frequency of the reflected light. The measurement unit 34 outputs the spectrum of the reflected light to the operation device 35.

Figure 5:
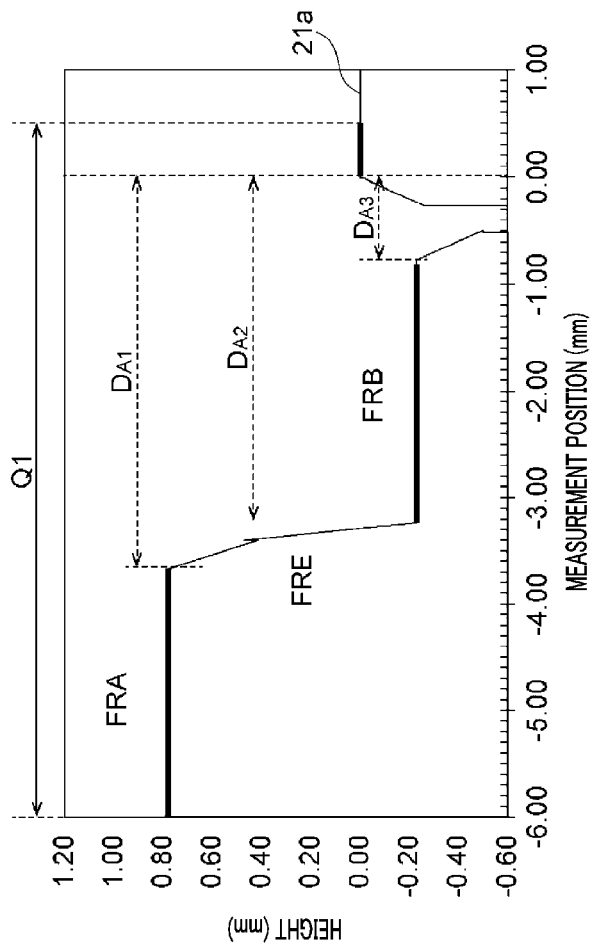
FIG. 5 is a diagram illustrating an example of a scanning range of the position detection system according to the exemplary embodiment.

The operation device 35 calculates, for each optical element, a positional relationship between the placing table 21 and the focus ring FR based on the reflected light in the scanning range. FIG. 5 is a diagram illustrating the scanning range of the position detection system 3 according to the exemplary embodiment. In FIG. 5, the scanning of the first optical element 33A will be explained as an example. The first optical element 33A is moved within the first scanning range Q1 ranging from the substrate placing region 21a to the focus ring FR while outputting output light.

The output light outputted from the first optical element 33A is reflected by individual parts of the processing apparatus 2 in the scanning range. By way of example, the output light is reflected on the front surface and the rear surface of the facing electrode 27, the substrate placing region 21a of the placing table 21, and a front surface and a rear surface of the focus ring FR. The first optical element 33A acquires reflected light at each scanning position. The operation device 35 measures a height of the scanning range based on the spectrum of the reflected light.

The operation device 35 measures a distance $D_A$ between the placing table 21 and the focus ring FR in the horizontal direction based on a variation of the height of the scanning range. To elaborate, the operation device 35 measures the distance $D_A$ in the horizontal direction from the substrate placing region 21a to a position of a flat upper end portion FRA of the focus ring FR, a position of a flat lower end portion FRB of the focus ring FR, or a position between the flat portions of the focus ring FR which has a varying height. As an example, the operation device 35 measures a distance $D_{A1}$ from the substrate placing region 21a to the flat upper end portion FRA of the focus ring FR. The operation device 35 may measure a distance $D_{A2}$ to an inclined surface FRE of the focus ring FR or a distance $D_{A3}$ to the flat lower end portion FRB of the focus ring FR. These distances $D_{A1}$ to $D_{A3}$ are examples of the distance $D_A$, and the operation device 35 may alternatively measure the distance with respect to a portion other than the flat portions.

The second optical element 33B and the third optical element 33C are also allowed to scan in the respective scanning ranges. The operation device 35 measures a distance $D_B$ ($D_{B1}$, $D_{B2}$, $D_{B3}$) and a distance $D_C$ ($D_{C1}$, $D_{C2}$, $D_{C3}$) between the placing table 21 and the focus ring FR in the horizontal direction.

The operation device 35 calculates the positional relationship based on the distance D between the placing table 21 and the focus ring FR in the horizontal direction which is measured by each optical element. An outer diameter of the substrate placing region 21a and an inner diameter of the focus ring FR are previously set. Thus, the positional relationship between the placing table 21 and the focus ring FR are calculated by using the distance D in the horizontal direction, the inner diameter of the focus ring FR and the outer diameter of the substrate placing region 21a. Specifically, an inner diameter of the flat upper end portion FRA of the focus ring FR is referred to as $A_{FRA}$, and an outer diameter of the substrate placing region 21a is referred to as $A_{21}$. When centers of the substrate placing region 21a and the focus ring FR are coincident, the distance D ($D_{A1}$, $D_{B1}$, $D_{C1}$) in the horizontal direction is calculated by the following expression (1).

[Expression 1]

$$\frac{A_{FRA} - A_{21}}{2} = D_{A1} = D_{B1} = D_{C1} \tag{1}$$

Thus, the positional relationship between the placing table 21 and the focus ring FR is calculated based on a difference between the distance D ($D_{A1}$, $D_{B1}$, $D_{C1}$) in the horizontal direction and a value (($A_{FRA}-A_{21}$)/2) which is obtained by dividing a difference between the outer diameter of the substrate placing region 21a and the inner diameter of the focus ring FR by 2. That is, based on differences corresponding to the distances $D_{A1}$, $D_{B1}$, and $D_{C1}$, a deviation amount in center positions of the substrate placing region 21a and the focus ring FR and a deviation direction are calculated. For an inner diameter of the inclined surface FRE of the focus ring FR and an inner diameter of the flat lower end portion FRB of the focus ring FR, the aforementioned relationship is also established with respect to the distance D in the horizontal direction corresponding to each position. Thus, at least one of the set of the distances $D_{A1}$, $D_{B1}$, $D_{C1}$, the set of the distances $D_{A2}$, $D_{B2}$, $D_{C2}$, and the set of the $D_{A3}$, $D_{B3}$, $D_{C3}$ needs to be measured.

The control device MC adjusts a transfer position of the focus ring FR based on the positional relationship between the placing table 21 and the focus ring FR. If the difference between the distance D in the horizontal direction and the value obtained by dividing the difference between the outer diameter of the substrate placing region 21a and the inner diameter of the focus ring FR by 2 is larger than a preset threshold value, the operation device 35 outputs the difference corresponding to the measurement position of each optical element to the control device MC. In this case, the control device MC adjusts a teaching value (a parameter which controls an operation of the transfer device TU2) of the transfer device TU2 such that each difference becomes zero (0).

The control device MC adjusts the teaching value after the focus ring FR is carried out of the processing chamber S, and then carries the focus ring FR in again after the adjustment of the teaching value is completed. The control device MC may perform the adjustment of the teaching value without carrying the focus ring FR out of the processing chamber S, that is, in the state that the focus ring FR stays in the processing chamber S. The transfer device TU2 adjusts the transfer position of the focus ring FR through the adjustment of the teaching value by the control device MC.

A system 1 configured to transfer the focus ring FR according to the exemplary embodiment includes the transfer device TU2, the control device MC and the position detection system 3 described above. The control device MC and the operation device 35 of the position detection system 3 may not be configured as separate bodies. The control device MC may be configured to carry out a part or all of the functions of the operation device 35.

[Operation of System Configured to Transfer Focus Ring]

Figure 6:
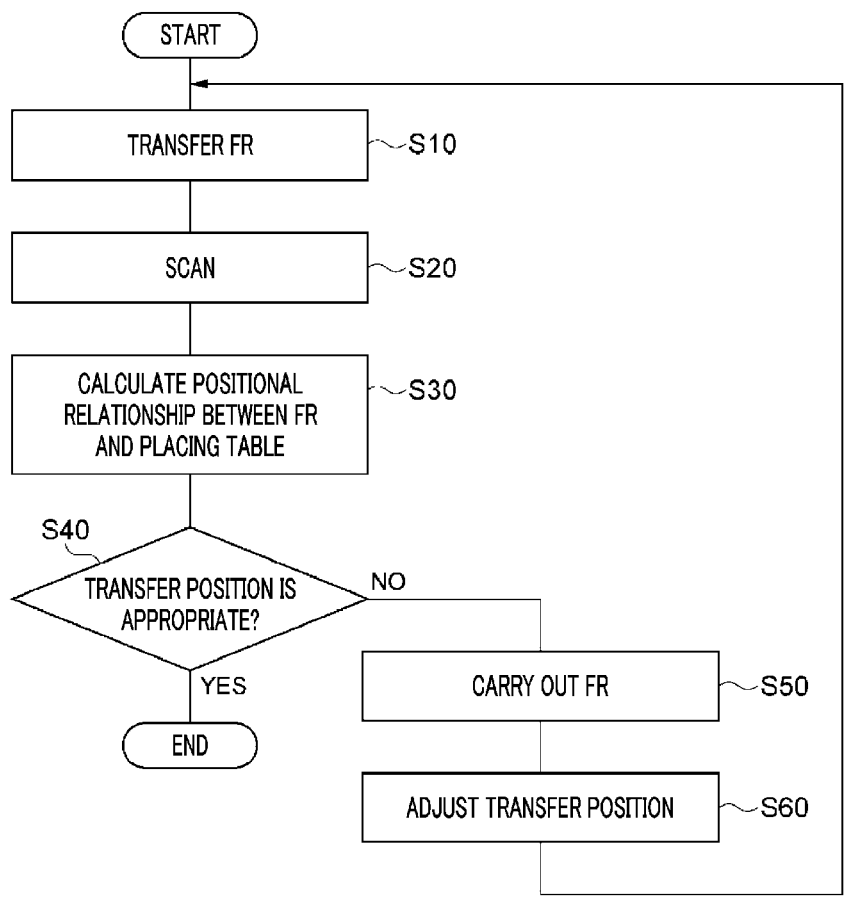
FIG. 6 is a flowchart illustrating an example processing of a focus ring transfer method according to the exemplary embodiment.

FIG. 6 is a flowchart illustrating an example processing of a method of transferring the focus ring FR according to the exemplary embodiment. The flowchart shown in FIG. 6 is performed by the system 1 when a new focus ring FR is carried in after a previous focus ring FR is separated from the focus ring placing region 21b.

As shown in FIG. 6, the transfer device TU2 transfers the focus ring FR onto the focus ring placing region 21b which surrounds the substrate placing region 21a on which the wafer W is placed (process S10). Then, the position detection system 3 performs scanning of the focus ring FR. As an example, the scanning range from the focus ring placing region 21b to the focus ring FR is scanned by the three optical elements (process S20).

The operation device 35 calculates the positional relationship between the placing table 21 and the focus ring FR based on the distance D between the substrate placing region 21a and the focus ring FR in the horizontal direction which is measured by each optical element. This positional relationship is calculated based on the outer diameter of the substrate placing region 21a, the inner diameter of the focus ring FR and the distance D between the substrate placing region 21a and the focus ring FR in the horizontal direction which is measured by each optical element (process S30).

The operation device 35 determines, based on the positional relationship between the placing table 21 and the focus ring FR, whether the transfer position of the focus ring FR is appropriate (process S40). If the difference between the distance D in the horizontal direction and the value obtained by dividing the difference between the outer diameter of the substrate placing region 21a and the inner diameter of the focus ring FR by 2 is equal to or less than the preset threshold value, the operation device 35 makes a determination that the transfer position of the focus ring FR is appropriate. If the transfer position is found to be appropriate (process S40: Yes), the processing of the flowchart of FIG. 6 is ended.

If, however, the difference between the distance D in the horizontal direction and the value obtained by dividing the difference between the outer diameter of the substrate placing region 21a and the inner diameter of the focus ring FR by 2 is larger than the preset threshold value, the operation device 35 makes a determination that the transfer position is inappropriate. If the transfer position is found to be inappropriate (process S40: NO), the transfer device TU2 carries out the focus ring FR (process S50). In this case, the operation device 35 outputs the difference between the distance D in the horizontal direction and the value obtained by dividing the difference between the outer diameter of the substrate placing region 21a and the inner diameter of the focus ring FR by 2 to the control device MC.

The control device MC adjusts the transfer position of the focus ring FR based on the positional relationship between the placing table 21 and the focus ring FR (process S60). The control device MC adjusts the teaching value (a control parameter which controls an operation of the transfer device TU2) of the transfer device TU2 so that each difference becomes zero (0). After the transfer position of the focus ring FR is adjusted, the focus ring FR is carried in again (process S10). Through these operations, the processes S10 to S60 are repeated until the determination that the transfer position is appropriate is made.

Second Exemplary Embodiment

Figure 7:
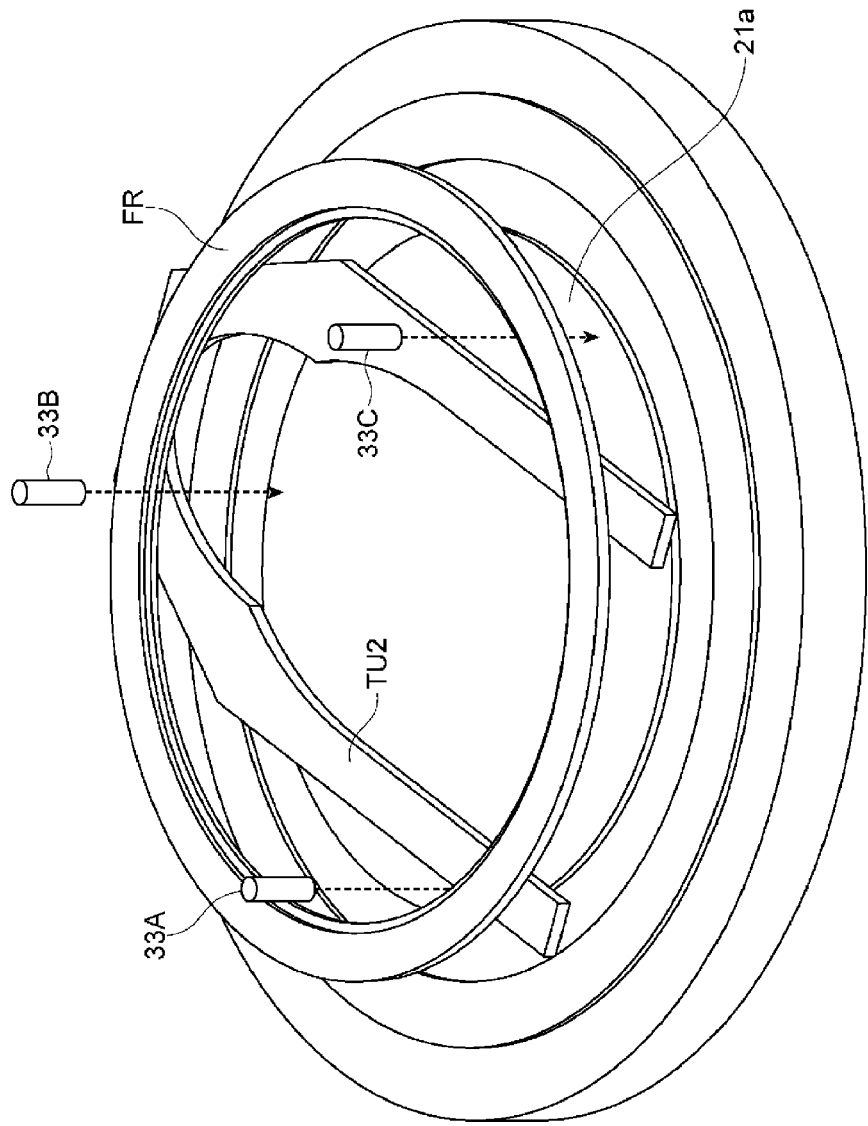
FIG. 7 is a diagram illustrating an example of determining a transfer position of a focus ring which is transferred by a transfer device.

FIG. 7 is a diagram illustrating an example of determining a transfer position of the focus ring FR being transferred. In a position detection system according to a second exemplary embodiment, a positional relationship between the placing table 21 and the focus ring FR is investigated by three or more optical elements before the focus ring FR is placed on the focus ring placing region 21b. By way of example, when the focus ring FR is transferred by the transfer device TU2, the position detection system investigates the positional relationship between the placing table 21 and the focus ring FR when the focus ring FR is placed on the pusher pin of the focus ring placing region 21b. The position detection system may investigate the positional relationship between the placing table 21 and the focus ring FR in the state that the focus ring FR is held by the transfer device TU2.

A first optical element 33A, a second optical element 33B, and a third optical element 33C are disposed at positions where they output output lights to a peripheral portion of the substrate placing region 21a. The first optical element 33A, the second optical element 33B and the third optical element 33C are arranged such that their irradiation positions are distanced apart from each other in the circumferential direction of the placing table 21.

Figure 8A:
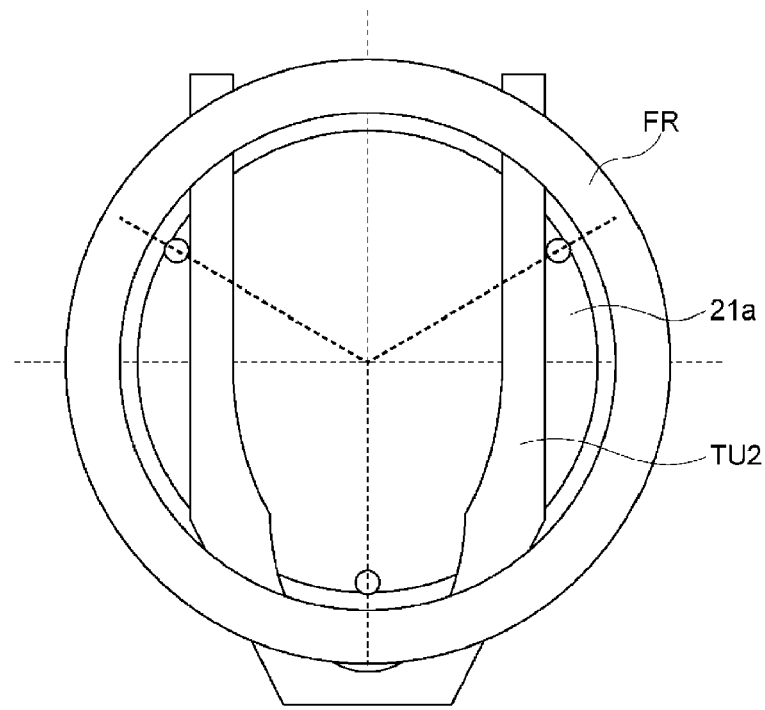
FIG. 8A and FIG. 8B are diagrams illustrating an example where a positional relationship between a placing table and the focus ring is appropriate.
Figure 8B:
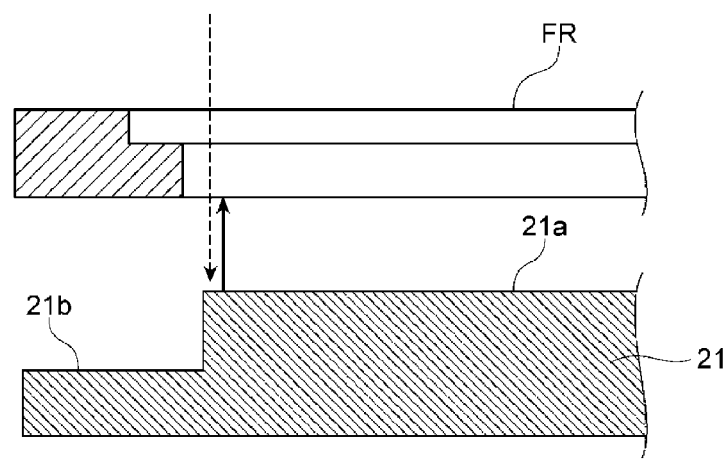

The operation device 35 investigates the positional relationship between the placing table 21 and the focus ring FR based on reflected light which has reached each optical element. FIG. 8A and FIG. 8B are diagrams illustrating an example where the positional relationship between the placing table 21 and the focus ring FR is appropriate. FIG. 8A is a plan view of the placing table 21 and the focus ring FR, and FIG. 8B is a partial cross sectional view of the placing table 21 and the focus ring FR. In FIG. 8A and FIG. 8B, a center position of the substrate placing region 21a and a center position of the focus ring FR are coincident. When the positional relationship between the placing table 21 and the focus ring FR is appropriate, the output light is reflected on a peripheral portion of the placing table 21 since the inner diameter of the focus ring FR is larger than the outer diameter of the substrate placing region 21a. If heights measured by the three optical elements all coincide with a preset height of the substrate placing region 21a, the operation device 35 makes a determination that the positional relationship between the placing table 21 and the focus ring FR is appropriate.

Figure 9A:
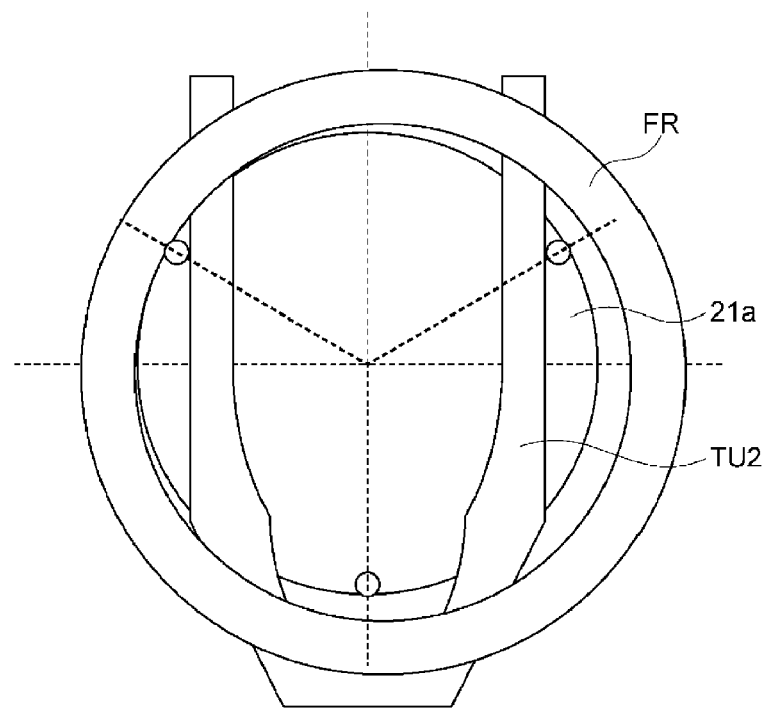
FIG. 9A and FIG. 9B are diagrams illustrating an example where a positional relationship between the placing table and the focus ring is inappropriate.
Figure 9B:
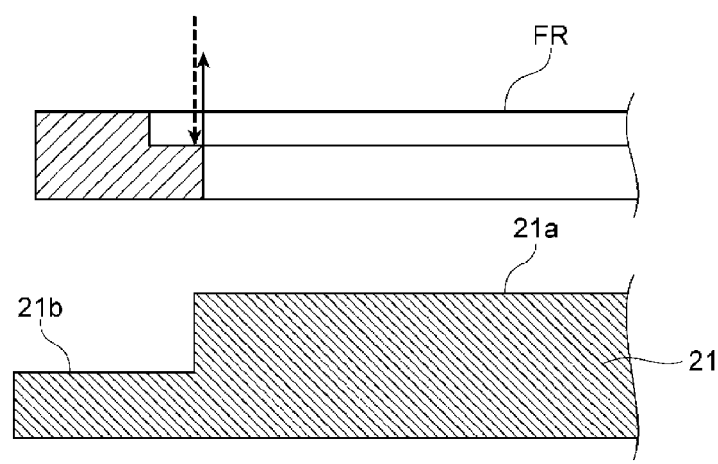

FIG. 9A and FIG. 9B are diagrams illustrating an example where the positional relationship between the placing table 21 and the focus ring FR is inappropriate. FIG. 9A is a plan view of the placing table 21 and the focus ring FR, and FIG. 9B is a partial cross sectional view of the placing table 21 and the focus ring FR. In FIG. 9A and FIG. 9B, the center position of the focus ring FR is deviated to the right from the center position of the substrate placing region 21a, so that the inner diameter of the focus ring FR and the outer diameter of the substrate placing region 21a are overlapped. When the positional relationship between the placing table 21 and the focus ring FR is inappropriate, the output light is reflected by the focus ring FR. If the height measured by at least one of the three optical elements does not coincide with the preset height of the substrate placing region 21a, the operation device 35 makes a determination that the positional relationship between the placing table 21 and the focus ring FR is inappropriate.

The operation device 35 outputs measurement results of the three optical elements to the control device MC. The control device MC adjusts a teaching value of the transfer device TU2 based on the measurement results of the three optical elements. The transfer device TU2 may carry out the focus ring FR from the chamber and then carry the focus ring FR into the chamber again with the adjusted teaching value. Alternatively, the transfer device TU2 may adjust a holding position of the focus ring FR within the chamber based on the adjusted teaching value.

If the focus ring FR is transferred in the state that the positional relationship between the placing table 21 and the focus ring FR is inappropriate, there is a likelihood that the focus ring FR and the placing table 21 come into contact with each other. The position detection system according to the second exemplary embodiment suppresses this contact between the focus ring FR and the placing table 21 by detecting a position of the focus ring FR being transferred.

The inventive features described in the second exemplary embodiment may be used in combination with the first exemplary embodiment. The system 1 may investigate the positional relationship between the placing table 21 and the focus ring FR in the process S10 in FIG. 6. For example, before the focus ring FR is placed on the focus ring placing region 21b after it is carried into the chamber, the positional relationship between the placing table 21 and the focus ring FR may be investigated by the three or more optical elements.

Third Exemplary Embodiment

Figure 10:
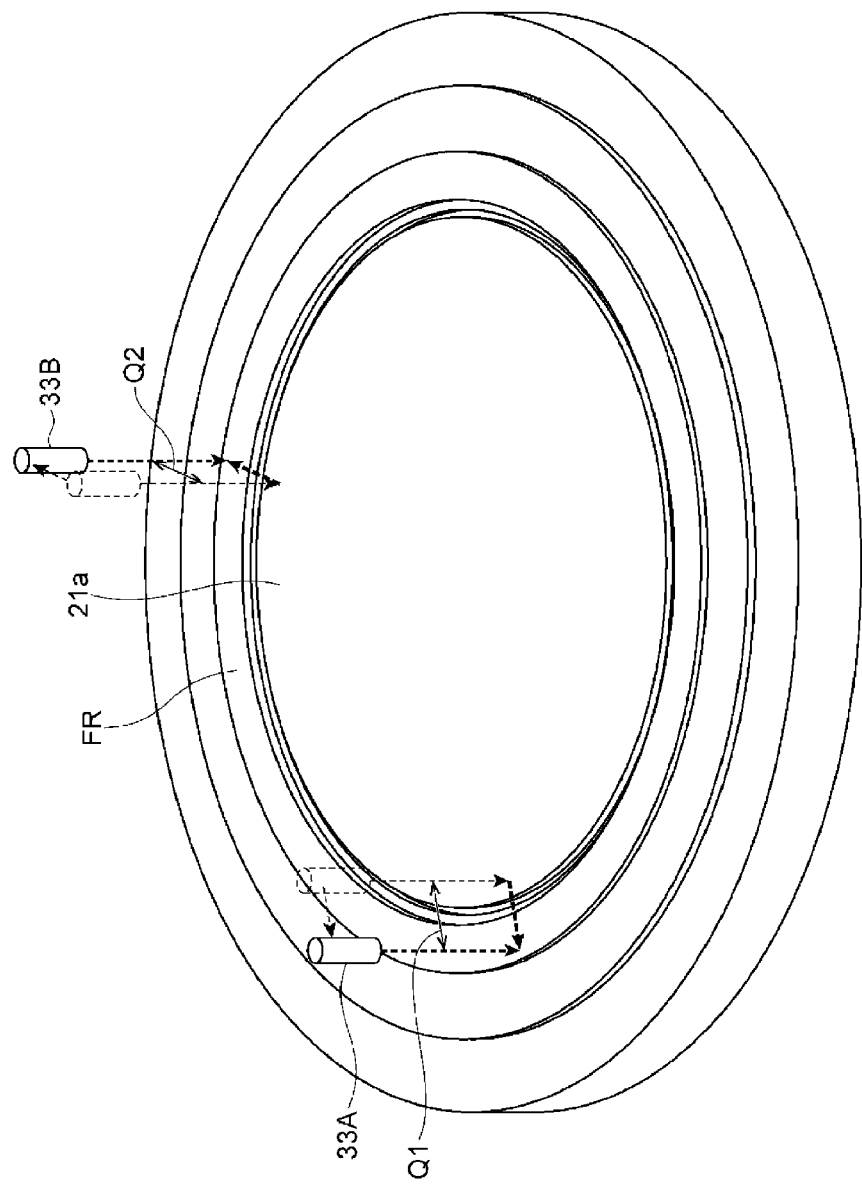
FIG. 10 is a diagram illustrating an example of scanning using two optical elements.

FIG. 10 is a diagram illustrating an example of scanning using two optical elements. In a position detection system according to the third exemplary embodiment, the operation device 35 calculates a positional relationship between the placing table 21 and the focus ring FR based on a distance D between the substrate placing region 21a and the focus ring FR in the horizontal direction which is measured by the two optical elements. In the position detection system according to the third exemplary embodiment, a first optical element 33A is disposed at a position which is not opposite from a second optical element 33B by 180 degrees with respect to a center position of the substrate placing region 21a.

Even if the number of the optical elements is two, the relationship of the aforementioned expression (1) is still established. Thus, the positional relationship between the placing table 21 and the focus ring FR is calculated based on a difference between the distance D in the horizontal direction and a value obtained by dividing the difference between the outer diameter of the substrate placing region 21a and the inner diameter of the focus ring FR by 2.

Figure 11A:
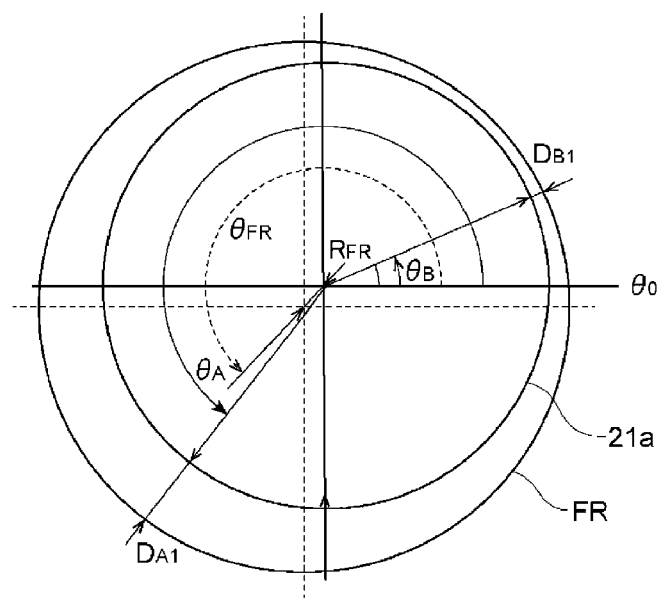
FIG. 11A and FIG. 11B are diagrams illustrating an example of calculating a positional relationship as polar coordinates from a result of the scanning using the two optical elements.
Figure 11B:
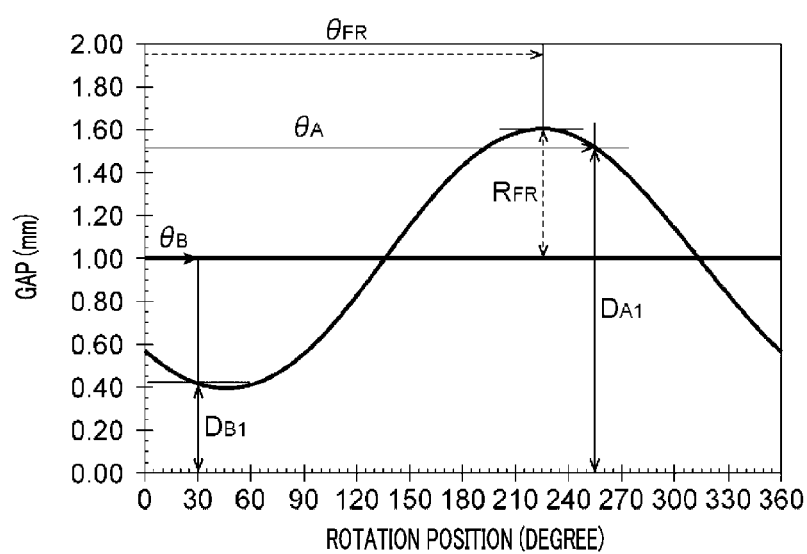

FIG. 11A and FIG. 11B are diagrams illustrating an example where the positional relationship is calculated as polar coordinates from scanning results using the two optical elements. FIG. 11A is a diagram illustrating a polar coordinate system in which a rotation position $\theta_0$ set with respect to a center position of the substrate placing region 21a is defined as a zero coordinate. A first optical element 33A is disposed at a rotation position $\theta_A$. A distance between the substrate placing region 21a and the focus ring FR in the horizontal direction at the rotation position $\theta_A$ is referred to as Dm. A second optical element 33B is disposed at a rotation position $\theta_B$. A distance between the substrate placing region 21a and the focus ring FR in the horizontal direction at the rotation position $\theta_B$ is referred to as $D_{B1}$.

FIG. 11B is a graph plotted based on the polar coordinates of FIG. 11A. A vertical axis represents a distance between the substrate placing region 21a and the focus ring FR in the horizontal direction, and a horizontal axis indicates a rotation position. When the center positions of the substrate placing region 21a and the focus ring FR are coincident, the distance between the substrate placing region 21a and the focus ring FR in the horizontal direction is maintained constant. In FIG. 11B, the distance in the horizontal direction which is maintained constant is, e.g., 1.0 mm. If the center position of the substrate placing region 21a and the center position of the focus ring FR are not coincident with each other, the distance in the horizontal direction varies in the shape of a sine wave, as illustrated in FIG. 11B. The distances $D_{A1}$ and $D_{B1}$ in the horizontal direction calculated by scanning of the first optical element 33A and the second optical element 33B are indicated as distances at the rotation position $\theta_A$ and the rotation position $\theta_B$ of the sine wave.

In FIG. 11A and FIG. 11B, a deviated distance between the center position of the substrate placing region 21a and the center position of the focus ring FR is referred to as $R_{FR}$, and a deviated rotation position is referred to as $\theta_{FR}$. The distances $D_{A1}$ and $D_{B1}$ in the horizontal direction calculated by the scanning of the first optical element 33A and the second optical element 33B satisfy relationships indicated by the following expressions (2) and (3) in relation with $R_{FR}$ and $\theta_{FR}$.

[Expression 2]

$$D_{A1} = \frac{A_{FR} - A_{21}}{2} + R_{FR} \cdot \cos(\theta_A - \theta_{FR}) \quad (2)$$

[Expression 3]

$$D_{B1} = \frac{A_{FR} - A_{21}}{2} + R_{FR} \cdot \cos(\theta_B - \theta_{FR}) \quad (3)$$

Since the rotation position $\theta_A$ and the rotation position $\theta_B$ are mounting positions of the optical elements, these positions are already known, and an inner diameter $A_{FR}$ of the focus ring FR and an outer diameter $A_{21}$ of the substrate placing region 21a are also already known. Thus, by solving simultaneous equations using the expressions (2) and (3), the operation device 35 is capable of calculating the deviated distance $R_{FR}$ and the deviated rotation position $\theta_{FR}$. As stated above, by calculating the positional relationship as the polar coordinates, a distance and a direction in which the position deviation between the focus ring FR and the placing table 21 is adjusted becomes clear.

MODIFICATION EXAMPLES

So far, the various exemplary embodiments have been described. However, the exemplary embodiments are not limiting, and various omissions, substitutions and changes may be made. Further, other exemplary embodiments may be embodied by combining elements in the various exemplary embodiments in a variety of other forms.

By way of example, the optical element is not limited to the focuser. The optical element is not particularly limited as long as it has a function of irradiating light to a target object and receiving reflected light therefrom. By way of example, the optical element may be a collimator or the like. Further, a SLD (Super Luminescent Diode) may be used as the light source 30, and in this case, a spectroscope is used as the measurement unit 34. The position detection system 3 may measure a distance from the optical element to a reflection position by using light interference with respect to the optical element.

The operation device 35 may calculate the positional relationship between the placing table 21 and the focus ring FR held on the focus ring placing region 21b as the polar coordinates from a scanning result of the three or more optical elements. As an example, polar coordinates are calculated from a scanning result of a third optical element 33C in addition to scanning results of the first and second optical elements 33A and 33B. If a distance in the horizontal direction, which is calculated as the third optical element 33C scans in a $\theta_C$ direction, is $D_{C1}$, the following expression (4) is satisfied.

[Expression 4]

$$D_{C1} = \frac{A_{FRA} - A_{21}}{2} + R_{FR} \cdot \cos(\theta_C - \theta_{FR})  \quad (4)$$

The operation device 35 is capable of using the simultaneous equations of the expressions (2) and (3), the simultaneous equations of the expressions (3) and (4), and the simultaneous equations of the expressions (2) and (4). Though the rotation position $\theta_A$, the rotation position $\theta_B$ and the rotation position $\theta_C$ are already known as they are mounting positions of the optical elements, there may exist an assembly error of the optical elements or the like. Further, there may be a measurement error as well. The operation device 35 is capable of reducing the error by averaging values of the respective simultaneous equations. The third exemplary embodiment can be applied to the first exemplary embodiment and the second exemplary embodiment.

SUMMARY OF EXEMPLARY EMBODIMENTS

According to the system and the method of the various exemplary embodiments, by allowing the multiple optical elements to scan, the height of the focus ring FR with respect to the height of the substrate placing region 21a is detected. Based on the variation amount of this height, the positional relationship between the focus ring FR and the placing table 21 in the scanning rage is calculated. The substrate placing region 21a has the circular shape, and the outer diameter of the substrate placing region 21a and the inner diameter of the focus ring FR are previously set. Thus, the position detection system is capable of calculating the positional relationship between the focus ring FR and the placing table 21 by allowing the multiple optical elements to scan, and thus capable of adjusting the transfer position of the focus ring FR based on this positional relationship.

According to the system and the method of the second exemplary embodiment, the positional relationship between the focus ring FR and the placing table 21 is investigated in the middle of the transfer of the focus ring FR. Therefore, according to the present system and method, a contact between the focus ring FR and the placing table 21 can be suppressed.

According to the system and the method of the third exemplary embodiment, the positional relationship between the focus ring FR and the placing table 21 is calculated as the polar coordinates. Therefore, the system is capable of clarifying the distance and the direction in which the position deviation between the focus ring FR and the placing table 21 is adjusted.

According to the present disclosure, it is possible to transfer the focus ring accurately.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A transfer system configured to transfer a focus ring into a processing apparatus, comprising:
   a transfer device and a position detection system,
   wherein the processing apparatus comprises:
   a chamber main body; and
   a placing table, disposed within a chamber provided by the chamber main body, having a substrate placing region and a focus ring placing region surrounding the substrate placing region, wherein the transfer device is configured to transfer the focus ring onto the focus ring placing region,
   wherein the position detection system comprises:
   a light source configured to generate measurement light;
   multiple optical elements each configured to output the measurement light generated from the light source as output light and configured to receive reflected light;
   a driving unit configured to move each of the multiple optical elements to allow each of the optical elements to scan a scanning range from the focus ring placed on the focus ring placing region to the substrate placing region; and
   a controller configured to calculate, based on the reflected light in the scanning range, a positional relationship between the placing table and the focus ring placed on the focus ring placing region for each of the multiple optical elements, and
   wherein the transfer device is configured to adjust a transfer position of the focus ring onto the focus ring placing region based on the positional relationship calculated by the controller.

2. The transfer system of claim 1,
   wherein the multiple optical elements is three or more optical elements,
   each of the multiple optical elements is disposed to output the measurement light to an end portion of a top surface of the substrate placing region, and
   the controller investigates, when the focus ring is transferred onto the focus ring placing region, a positional relationship between the substrate placing region and the focus ring held by the transfer device based on the reflected light on a circumference of the substrate placing region.

3. The transfer system of claim 1,
   wherein the controller is configured to calculate the positional relationship between the placing table and the focus ring placed on the focus ring placing region as polar coordinates.

4. A transfer method of transferring a focus ring, comprising:
   transferring the focus ring onto a focus ring placing region surrounding a substrate placing region of a placing table on which a substrate is placed;
   scanning a scanning range from the focus ring placed on the focus ring placing region to the substrate placing region with multiple optical elements each configured to output measurement light as output light and configured to receive reflected light;
   calculating a positional relationship between the placing table and the focus ring placed on the focus ring placing region based on the reflected light in the scanning range; and
   deciding a transfer position of the focus ring based on the positional relationship between the placing table and the focus ring placed on the focus ring placing region, which is calculated through the calculating of the positional relationship.

* * * * *

UNITED STATES PATENT AND TRADEMARK OFFICE
CERTIFICATE OF CORRECTION

PATENT NO. : 11,869,752 B2
APPLICATION NO. : 17/111679
DATED : January 9, 2024
INVENTOR(S) : Kippei Sugita et al.

Page 1 of 1

It is certified that error appears in the above-identified patent and that said Letters Patent is hereby corrected as shown below:

In the Specification

Column 13, Line 48, "Dm" should be -- $D_{A1}$ --.

Signed and Sealed this
Fifteenth Day of July, 2025

Coke Morgan Stewart
*Acting Director of the United States Patent and Trademark Office*